(12) United States Patent
Thielemans et al.

(10) Patent No.: US 12,494,165 B2
(45) Date of Patent: *Dec. 9, 2025

(54) REAL-TIME DEFORMABLE AND TRANSPARENT DISPLAY

(71) Applicant: STEREYO BV, Nazareth (BE)

(72) Inventors: Robbie Thielemans, Nazareth (BE); Vince Dundee, Glendale, CA (US); Marc Johan Van Eekeren, Marietta, GA (US); Steve Simard, Marietta, GA (US)

(73) Assignee: STEREYO BV, Nazareth (BE)

( * ) Notice: Subject to any disclaimer, the term of this patent is extended or adjusted under 35 U.S.C. 154(b) by 0 days.

This patent is subject to a terminal disclaimer.

(21) Appl. No.: 18/600,108

(22) Filed: Mar. 8, 2024

(65) Prior Publication Data

US 2024/0212596 A1 Jun. 27, 2024

Related U.S. Application Data

(63) Continuation of application No. 18/100,198, filed on Jan. 23, 2023, now Pat. No. 11,948,506, which is a
(Continued)

(30) Foreign Application Priority Data

Mar. 7, 2019 (BE) .................................. 2019/5142
Mar. 28, 2019 (BE) .................................. 2019/5196

(51) Int. Cl.
*G09G 3/3225* (2016.01)
*H01L 25/075* (2006.01)
(Continued)

(52) U.S. Cl.
CPC ....... *G09G 3/3225* (2013.01); *H01L 25/0753* (2013.01); *H01L 25/167* (2013.01);
(Continued)

(58) Field of Classification Search
CPC .............. G06F 3/04184; G09G 3/3266; G09G 2310/0289; G09G 2310/0291; G09G 2354/00
See application file for complete search history.

(56) References Cited

U.S. PATENT DOCUMENTS 5,767,818 A  6/1998 Nishida
6,055,071 A  4/2000 Kuwata et al.
(Continued)

FOREIGN PATENT DOCUMENTS

BE  20195196  3/2019
BE  20195142  7/2019
(Continued)

OTHER PUBLICATIONS

Baker, Simon, "Pulse Width Modulation (PWM)", Mar. 17, 2015, 13 pages, TFT Central.
(Continued)

*Primary Examiner* — Kenneth B Lee, Jr.
(74) *Attorney, Agent, or Firm* — Workman Nydegger

(57) ABSTRACT

A deformable display is provided, particularly a flexible, stretchable, and transparent deformable display based on light-emitting elements such as for example light-emitting diodes (LEDs). Methods of use and applications of such deformable display, including systems and methods making use of such deformable display. In addition a flexible, stretchable and transparent display is provided being deformable in real-time while maintaining deformability.

24 Claims, 4 Drawing Sheets

Related U.S. Application Data continuation of application No. 16/813,113, filed on Mar. 9, 2020, now Pat. No. 11,610,543.

(51) Int. Cl.
*H01L 25/16* (2023.01)
*H05K 1/14* (2006.01)
*H05K 1/18* (2006.01)

(52) U.S. Cl.
CPC ..... *H05K 1/189* (2013.01); *G09G 2320/0242* (2013.01); *G09G 2320/0693* (2013.01); *G09G 2380/02* (2013.01); *H05K 1/14* (2013.01); *H05K 2201/10106* (2013.01); *H05K 2201/10143* (2013.01); *H05K 2201/10151* (2013.01)

(56) References Cited

U.S. PATENT DOCUMENTS

| | | |
|---|---|---|
| 6,483,555 B1 | 11/2002 | Thielemans et al. |
| 6,717,625 B1 | 4/2004 | Thielemans |
| 7,015,902 B2 | 3/2006 | Nagai et al. |
| 7,019,721 B2 | 3/2006 | Thielemans et al. |
| 7,071,620 B2 | 7/2006 | Devos et al. |
| 7,071,894 B1 | 7/2006 | Thielemans et al. |
| 7,079,092 B2 | 7/2006 | Tanghe et al. |
| 7,102,601 B2 | 9/2006 | Devos et al. |
| 7,157,838 B2 | 1/2007 | Thielemans et al. |
| 7,176,861 B2 | 2/2007 | Dedene et al. |
| 7,205,729 B2 | 4/2007 | Thielemans et al. |
| 7,227,519 B1 | 6/2007 | Kawase et al. |
| 7,262,753 B2 | 8/2007 | Tanghe et al. |
| 7,301,273 B2 | 11/2007 | Dedene et al. |
| 7,365,720 B2 | 4/2008 | Bouwens et al. |
| 7,443,466 B2 | 10/2008 | Dedene et al. |
| 7,777,691 B1 | 8/2010 | Nimmer et al. |
| D730,309 S | 5/2015 | Hochman et al. |
| 9,069,519 B1 | 6/2015 | Hall |
| 9,247,648 B2 | 1/2016 | Vanfleteren et al. |
| D751,998 S | 3/2016 | Hochman et al. |
| 9,380,720 B2 | 6/2016 | Thielemans et al. |
| 9,418,927 B2 | 8/2016 | Axisa et al. |
| 9,477,438 B1 | 10/2016 | Hochman et al. |
| D771,844 S | 11/2016 | Hochman et al. |
| 9,524,666 B2 | 12/2016 | Hochman et al. |
| 9,660,403 B2 | 5/2017 | Hochman et al. |
| 10,325,541 B2 | 6/2019 | Hochman et al. |
| 10,333,109 B2 | 6/2019 | Hochman et al. |
| 10,892,297 B2 | 1/2021 | Chae et al. |
| 10,917,679 B2 | 2/2021 | Dunning et al. |
| 11,310,436 B2 | 4/2022 | Hochman et al. |
| 11,328,655 B2 | 5/2022 | Sugiyama et al. |
| 11,445,123 B2 | 9/2022 | Deighton |
| 11,496,726 B2 | 11/2022 | Deighton |
| 11,552,061 B2 | 1/2023 | Chae et al. |
| 11,610,543 B2 * | 3/2023 | Thielemans ........... H05K 1/189 |
| 11,695,907 B2 | 7/2023 | Steudel et al. |
| 11,881,151 B2 | 1/2024 | Thielemans et al. |
| 11,924,560 B2 | 3/2024 | Thielemans et al. |
| 11,948,501 B2 | 4/2024 | Thielemans et al. |
| 11,948,506 B2 | 4/2024 | Thielemans et al. |
| 2002/0163513 A1 | 11/2002 | Tsuji |
| 2003/0095138 A1 | 5/2003 | Kim et al. |
| 2003/0128299 A1 | 7/2003 | Coleman et al. |
| 2003/0133619 A1 | 7/2003 | Wong et al. |
| 2004/0113875 A1 | 6/2004 | Miller et al. |
| 2004/0207315 A1 | 10/2004 | Thielemans et al. |
| 2004/0212582 A1 | 10/2004 | Thielemans et al. |
| 2004/0233125 A1 | 11/2004 | Tanghe et al. |
| 2004/0233148 A1 | 11/2004 | Tanghe et al. |
| 2005/0017922 A1 | 1/2005 | Devos et al. |
| 2005/0052375 A1 | 3/2005 | Devos et al. |
| 2005/0116667 A1 | 6/2005 | Mueller et al. |
| 2005/0122406 A1 | 6/2005 | Voss et al. |
| 2005/0128751 A1 | 6/2005 | Roberge et al. |
| 2005/0133761 A1 | 6/2005 | Thielemans |
| 2005/0134525 A1 | 6/2005 | Tanghe et al. |
| 2005/0134526 A1 | 6/2005 | Willem et al. |
| 2005/0213128 A1 | 9/2005 | Imai et al. |
| 2006/0022914 A1 | 2/2006 | Kimura et al. |
| 2006/0139238 A1 | 6/2006 | Chiba et al. |
| 2006/0290614 A1 | 12/2006 | Nathan et al. |
| 2007/0081357 A1 | 4/2007 | Kim et al. |
| 2007/0241988 A1 | 10/2007 | Zerphy et al. |
| 2007/0253008 A1 | 11/2007 | Edge et al. |
| 2007/0263394 A1 | 11/2007 | Thielemans et al. |
| 2008/0046217 A1 | 2/2008 | Polonskiy et al. |
| 2008/0079816 A1 | 4/2008 | Yen et al. |
| 2008/0111773 A1 | 5/2008 | Tsuge |
| 2008/0165081 A1 | 7/2008 | Lawther et al. |
| 2008/0285981 A1 | 11/2008 | Diab et al. |
| 2009/0009103 A1 | 1/2009 | McKechnie et al. |
| 2009/0066631 A1 | 3/2009 | Lianza |
| 2009/0102957 A1 | 4/2009 | Phelan |
| 2009/0103200 A1 | 4/2009 | Feklistov et al. |
| 2009/0295706 A1 | 12/2009 | Feng |
| 2010/0001648 A1 | 1/2010 | De Clercq et al. |
| 2010/0103200 A1 | 4/2010 | Langendijk |
| 2010/0243025 A1 | 9/2010 | Bhatia et al. |
| 2010/0289783 A1 | 11/2010 | Leppla |
| 2010/0302284 A1 | 12/2010 | Karaki |
| 2010/0309218 A1 | 12/2010 | Suen et al. |
| 2011/0103013 A1 | 5/2011 | Furukawa |
| 2011/0121761 A1 | 5/2011 | Zhao |
| 2011/0176029 A1 | 7/2011 | Boydston et al. |
| 2012/0019633 A1 | 1/2012 | Holley |
| 2012/0033876 A1 | 2/2012 | Momeyer et al. |
| 2012/0062622 A1 | 3/2012 | Koyama et al. |
| 2012/0133837 A1 | 5/2012 | Furukawa |
| 2012/0287289 A1 | 11/2012 | Steinberg et al. |
| 2012/0307243 A1 | 12/2012 | Elliott |
| 2012/0313979 A1 | 12/2012 | Matsuura |
| 2013/0162696 A1 | 6/2013 | Matsumoto |
| 2013/0181884 A1 | 7/2013 | Perkins et al. |
| 2013/0226495 A1 | 8/2013 | Marcu et al. |
| 2013/0249377 A1 | 9/2013 | Hamer et al. |
| 2013/0272023 A1 | 10/2013 | Lai |
| 2014/0002718 A1 | 1/2014 | Spielberg |
| 2014/0009485 A1 | 1/2014 | Asanuma |
| 2014/0009505 A1 | 1/2014 | Moon et al. |
| 2014/0049571 A1 | 2/2014 | Erinjippurath et al. |
| 2014/0049983 A1 | 2/2014 | Nichol et al. |
| 2014/0125818 A1 | 5/2014 | Friend |
| 2015/0070402 A1 | 3/2015 | Shah et al. |
| 2015/0186097 A1 | 7/2015 | Hall |
| 2015/0229919 A1 | 8/2015 | Weber et al. |
| 2015/0339977 A1 | 11/2015 | Nathan et al. |
| 2015/0348479 A1 | 12/2015 | Kim et al. |
| 2015/0371405 A1 | 12/2015 | Zhao |
| 2016/0078802 A1 | 3/2016 | Liang et al. |
| 2016/0124091 A1 | 5/2016 | Kawahito et al. |
| 2016/0182790 A1 | 6/2016 | Horesh |
| 2016/0275835 A1 | 9/2016 | Yuan et al. |
| 2016/0335958 A1 | 11/2016 | Huang et al. |
| 2017/0005077 A1 * | 1/2017 | Kim ................... H05K 1/0274 |
| 2017/0032715 A1 | 2/2017 | Sutherland et al. |
| 2017/0032742 A1 | 2/2017 | Piper et al. |
| 2017/0061924 A1 | 3/2017 | Lee et al. |
| 2017/0069871 A1 * | 3/2017 | Yim ..................... H10K 59/873 |
| 2017/0171492 A1 | 6/2017 | Naito |
| 2017/0284630 A1 | 10/2017 | Sergenese et al. |
| 2017/0318178 A1 | 11/2017 | Debevec et al. |
| 2018/0018793 A1 | 1/2018 | Min et al. |
| 2018/0060014 A1 | 3/2018 | Son et al. |
| 2018/0090102 A1 | 3/2018 | Chappalli et al. |
| 2018/0091860 A1 | 3/2018 | Stokking et al. |
| 2018/0131160 A1 | 5/2018 | Zhang et al. |
| 2018/0235052 A1 | 8/2018 | Tada |
| 2018/0240409 A1 | 8/2018 | Li et al. |
| 2018/0342224 A1 | 11/2018 | Beon et al. |
| 2019/0064923 A1 | 2/2019 | Taniguchi |
| 2019/0080656 A1 | 3/2019 | Herranz et al. |
| 2019/0098293 A1 | 3/2019 | Lee et al. |

(56) References Cited

U.S. PATENT DOCUMENTS

| | | |
|---|---|---|
| 2019/0132560 A1 | 5/2019 | Grosse et al. |
| 2019/0172404 A1 | 6/2019 | Zhu |
| 2019/0209858 A1 | 7/2019 | Slaughter et al. |
| 2019/0212719 A1 | 7/2019 | Ono |
| 2019/0213951 A1 | 7/2019 | Li et al. |
| 2019/0244561 A1 | 8/2019 | Zong et al. |
| 2019/0295457 A1 | 9/2019 | Li et al. |
| 2019/0306477 A1 | 10/2019 | Nordback |
| 2019/0356940 A1 | 11/2019 | Mallett |
| 2019/0364309 A1 | 11/2019 | Von Braun et al. |
| 2019/0377535 A1 | 12/2019 | Rycyna et al. |
| 2020/0014904 A1 | 1/2020 | Wetzstein et al. |
| 2020/0027386 A1 | 1/2020 | Wang et al. |
| 2020/0037011 A1 | 1/2020 | Zong et al. |
| 2020/0043201 A1 | 2/2020 | Tanaka et al. |
| 2020/0098333 A1 | 3/2020 | Marcu |
| 2020/0126501 A1 | 4/2020 | Yamazaki et al. |
| 2020/0160791 A1 | 5/2020 | Chung |
| 2020/0225903 A1 | 7/2020 | Cohen |
| 2020/0280761 A1 | 9/2020 | Staples |
| 2020/0286424 A1 | 9/2020 | Thielemans et al. |
| 2020/0388210 A1 | 12/2020 | Thielemans et al. |
| 2020/0403117 A1 | 12/2020 | Fabien et al. |
| 2021/0005161 A1 | 1/2021 | Lee |
| 2021/0014385 A1 | 1/2021 | Boggavarapu et al. |
| 2021/0056937 A1 | 2/2021 | Sakai |
| 2021/0124174 A1 | 4/2021 | Tokunaga et al. |
| 2021/0125545 A1 | 4/2021 | Sohn et al. |
| 2021/0125570 A1 | 4/2021 | Kang et al. |
| 2021/0185778 A1 | 6/2021 | Otten |
| 2021/0201769 A1 | 7/2021 | Morris et al. |
| 2021/0217157 A1 | 7/2021 | Han et al. |
| 2021/0225267 A1 | 7/2021 | Thielemans et al. |
| 2021/0227270 A1 | 7/2021 | Braun |
| 2021/0266624 A1 | 8/2021 | Zong et al. |
| 2021/0295766 A1 | 9/2021 | Sugiyama et al. |
| 2021/0297717 A1 | 9/2021 | Braun |
| 2021/0306394 A1 | 9/2021 | Zong et al. |
| 2021/0321032 A1 | 10/2021 | Braun |
| 2021/0345058 A1 | 11/2021 | Itakura et al. |
| 2021/0366411 A1 | 11/2021 | Yang et al. |
| 2021/0383842 A1 | 12/2021 | Han et al. |
| 2021/0397398 A1 | 12/2021 | Han et al. |
| 2022/0014728 A1 | 1/2022 | Deighton |
| 2022/0020727 A1 | 1/2022 | Noh et al. |
| 2022/0059045 A1 | 2/2022 | Kobayashi et al. |
| 2022/0059607 A1 | 2/2022 | Murugan et al. |
| 2022/0060612 A1 | 2/2022 | Hochman et al. |
| 2022/0076615 A1 | 3/2022 | Ding et al. |
| 2022/0103738 A1 | 3/2022 | Deighton |
| 2022/0150456 A1 | 5/2022 | Steudel et al. |
| 2022/0191109 A1 | 6/2022 | Chen et al. |
| 2022/0246670 A1 | 8/2022 | Chen et al. |
| 2022/0254317 A1 | 8/2022 | Hochman et al. |
| 2022/0350562 A1 | 11/2022 | Wang et al. |
| 2022/0375387 A1 | 11/2022 | Deighton |
| 2022/0375403 A1 | 11/2022 | Cheng et al. |
| 2022/0413790 A1 | 12/2022 | Cai et al. |
| 2023/0013582 A1 | 1/2023 | Wang et al. |
| 2023/0154399 A1 | 5/2023 | Thielemans et al. |
| 2023/0162400 A1 | 5/2023 | Liu et al. |
| 2023/0162662 A1 | 5/2023 | Zhang et al. |
| 2023/0163142 A1 | 5/2023 | Lu et al. |
| 2023/0186821 A1 | 6/2023 | Hashempour et al. |
| 2023/0209207 A1 | 6/2023 | Hochman et al. |
| 2023/0274693 A1 | 8/2023 | Thielemans et al. |
| 2023/0282153 A1 | 9/2023 | Thielemans et al. |
| 2023/0298503 A1 | 9/2023 | Zhang et al. |
| 2023/0326175 A1 | 10/2023 | Zhang et al. |
| 2024/0022686 A1 | 1/2024 | Thielemans et al. |
| 2024/0044465 A1 | 2/2024 | Thielemans et al. |

FOREIGN PATENT DOCUMENTS

| | | |
|---|---|---|
| BE | 1026226 A1 | 11/2019 |
| CN | 102290003 A | 12/2011 |
| CN | 206741357 U | 12/2017 |
| CN | 207352560 U | 5/2018 |
| CN | 110602875 A | 12/2019 |
| CN | 110617000 A | 12/2019 |
| DE | 102006054856 A1 | 1/2009 |
| EP | 1172783 A1 | 1/2002 |
| EP | 1780798 A1 | 5/2007 |
| EP | 2323072 A1 | 5/2011 |
| EP | 3099058 A1 | 11/2016 |
| EP | 3139422 A2 | 3/2017 |
| GB | 2469819 A | 11/2010 |
| JP | 2007062892 A | 3/2007 |
| JP | 2019214445 A | 12/2019 |
| KR | 20170065163 A | 6/2017 |
| TW | 200608327 A | 3/2006 |
| TW | 200608328 A | 3/2006 |
| WO | 2013186278 A1 | 12/2013 |
| WO | 2015114720 A1 | 8/2015 |
| WO | 2018164105 A1 | 9/2018 |
| WO | 2019215219 A1 | 11/2019 |
| WO | 2020253249 A1 | 12/2020 |
| WO | 2021009719 A1 | 1/2021 |
| WO | 2022013191 A1 | 1/2022 |
| WO | 2022064062 A1 | 3/2022 |
| WO | 2022087322 A1 | 4/2022 |

OTHER PUBLICATIONS

Burr, David, "Motion Perception: Human Psychophysics", Apr. 18, 2013, pp. 763-776, MIT Press.
Cast, Inc.,"Understanding—and Reducing—Latency in Video Compression Systems", Oct. 25, 2013, 7 pages, retrieved from <https://web.archive.org/web/20131025202911/https://www.design-reuse.com/articles/33005/understanding-latency-in-video-compression-systems.html>.
Davis et al., "Humans perceive flicker artifacts at 500 Hz", Feb. 3, 2015, 4 pages, Nature, Scientific Reports.
Kang et al., "Nanoimprinted Semitransparent Metal Electrodes and Their Application in Organic Light-Emitting Diodes," May 21, 2007, 6 pages, Advanced Materials.
Larson, Jennifer, "How Many Frames Per Second Can the Human Eye See?", Oct. 20, 2020, 12 pages, retrieved from <https://www.healthline.com/health/human-eye-fps>.
Lee et al., "Solution-Processed Metal Nanowire Mesh Transparent Electrodes", Jan. 12, 2008, pp. 689-692, Nano Letters, vol. 8, No. 2.
Mackin et al., "High Frame Rates and the Visibility of Motion Artifacts", Jun. 30, 2017, 19 pages, SMPTE Motion Imaging Journal, vol. 126, Issue 5.
Thielemans, Robbie, "Displays Applications of LEDs", Handbook of Visual Display Technology, May 21, 2011, 14 pages.
Thielemans, Robbie, "LED Display Applications and Design Considerations", Handbook of Visual Display Technology, May 21, 2011, 5 pages, retrieved from https://link.springer.com/referenceworkentry/10.1007/978-3-540-79567-4_76.
Tobii Connect, "The speed of human visual perception", Sep. 14, 2022, 1 page, retrieved from <https://connect.tobii.com/s/article/the-speed-of-human-perception?language=en_US>.
Wikipedia, "MAC Address", 10 pages, retrieved from <https://en.wikipedia.org/wiki/MAC_address>.
Wilson, Derek, "Exploring Input Lag Inside Out", Jul. 16, 2019, 2 pages, retrieved from <https://www.anandtech.com/show/2803>.
Zhang, Yin, "Performance Characteristics of Lithium Coin Cells for Use in Wireless Sensing Systems", Jun. 17, 2012, 143 pages, All Theses and Dissertations, Brigham Young University.
"The Ins and Outs of HDR—Gamma Curves", Jun. 8, 2020, 3 pages, retrieved from <https://www.eizoglobal.com/library/management/ins-and-outs-of-hdr/index2.html>.
Extended European Search Report from corresponding EP Application No. EP18198749.6, Nov. 12, 2018.

(56) References Cited

OTHER PUBLICATIONS

International Search Report and Written Opinion from PCT Application No. PCT/EP2019/061804, Jun. 13, 2019.
Applicant's Amendment/Remarks filed at the EPO on Feb. 20, 2020 for PCT/EP2019/061804.
Applicant's Amendment/Remarks filed at the EPO on May 26, 2020 for PCT/EP2019/061804.
International Preliminary Report on Patentability from PCT/EP2019/061804, Jul. 10, 2020.
Belgian Search Report from BE Application No. 201905196, Aug. 13, 2019.
Search Report for BE 2019/05759 mailed Jan. 23, 2020, 18 pages.
Belgian Search Report from corresponding Belgian Application No. BE 202205007, Jun. 7, 2022.
Extended European Search Report from corresponding EP Application No. 22185014.2, Dec. 8, 2022.
Office Action from European Application No. 19722133.6, Jan. 19, 2023.
Belgian Search Report from Belgian Patent Application No. BE202305595, Nov. 21, 2023.
Response to Belgian Search Report from Belgian Patent Application No. BE2023/5595, filed Mar. 21, 2024.
Extended European Search Report from European Patent Application No. EP23185674.1, Nov. 16, 2023.
Partial European Search Report from European Patent Application No. EP23198096, Nov. 29, 2023.
Extended European Search Report from European Patent Application No. EP23198096.2, Apr. 9, 2024.
Extended European Search Report from European Patent Application No. EP23190432.7, Feb. 12, 2024.
Extended European Search Report from European Patent Application No. EP23160521, Jul. 6, 2023.
Response to Extended European Search Report from European Patent Application No. EP23160521, dated Jan. 29, 2024.
Extended European Search Report from European Patent Application No. EP23218322.8, Mar. 27, 2024.
Extended European Search Report from European Patent Application No. EP23218336.8, Apr. 10, 2024.
Partial European Search Report from European Patent Application No. EP23218348.3, Apr. 30, 2024.
Extended European Search Report from European Patent Application No. EP23218353.3, Mar. 26, 2024.
Extended European Search Report from European Patent Application No. EP23218356.6, Apr. 5, 2024.
Extended European Search Report from European Patent Application No. EP23218377.2, Apr. 24, 2024.
Jung-Yong Lee, "Solution-Processed Metal Nanowire Mesh Transparent Electrodes," Nano Letters, vol. 8, No. 2 pp. 689-692, Dec. 18, 2007.
Myung-Gyu Kang, "Nanoimprinted Semitransparent Metal Electrodes and Their Application in Organic Light-Emitting Diodes," Advanced Materials, May 21, 2007.
Belgian Search Report from BE Application No. BE201905196, Aug. 13, 2019.
Belgian Search Report for Belgian Patent Application No. BE2019/5970, Jul. 24, 2020.
Response to Belgian Search Report for Belgian Patent Application No. BE2019/5970, filed by Applicant at the Belgian Patent Office on Nov. 24, 2020.

* cited by examiner

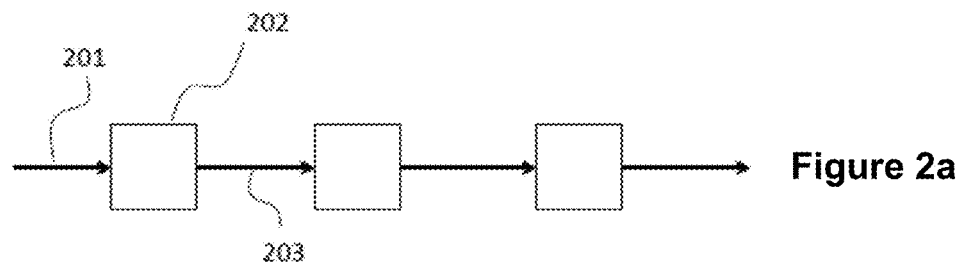
Figure 2a
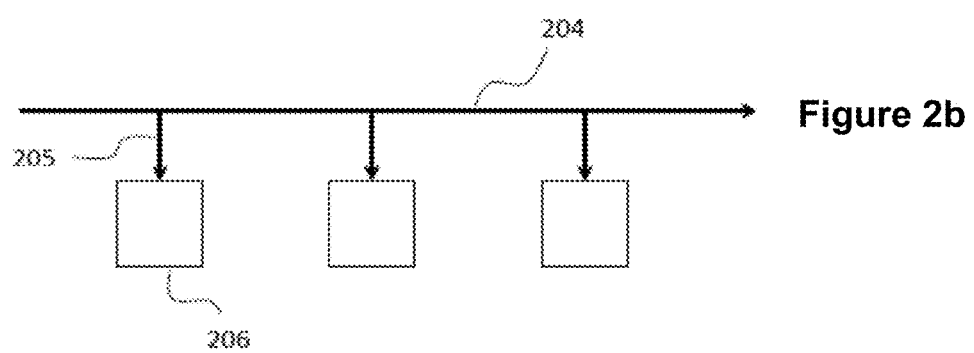
Figure 2b
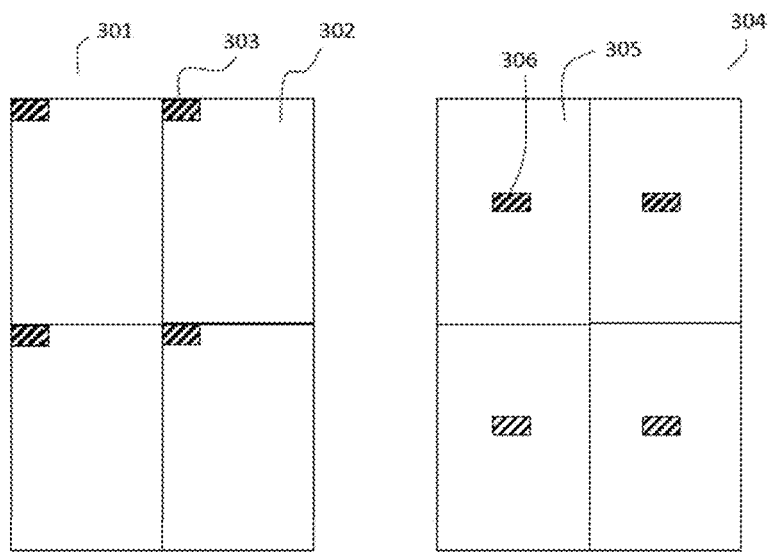
Figure 3a
Figure 3b

REAL-TIME DEFORMABLE AND TRANSPARENT DISPLAY

TECHNICAL FIELD

The invention relates to a deformable display, more in particular the invention relates to a flexible, stretchable, and transparent deformable display using or based on light-emitting elements such as for example light-emitting diodes (LEDs). The invention also relates to the use and applications of such deformable display, including systems and methods making use of such deformable display. In addition the invention relates to a flexible, stretchable and transparent display being deformable in real-time while maintaining deformability.

BACKGROUND OF THE INVENTION

Transparent displays, such as for instance LCD and OLED displays as currently known typically make use of indium tin oxide (ITO) layers as thin films with optical transparency and comprising electrically conductive material. The high resistivity of such ITO layers however allows very little current to be transmitted, and hence results in very slow acting or switching circuits. As a consequence, transparent displays from the art are not really suitable for video applications.

State-of-the-art flexible displays represent either a one-time flexibility, or either they remain being flexible although such flexibility is always restricted in some way. This latter flexible display remaining flexible usually can be seen as a combination of multiple small rigid bodies being movably connected or hinged to each other. Due to this partially movable configuration, bending of such flexible displays is limited. In case of one-time flexibility, the flexible display is bent and then usually kept in a particular form. The form or shape is hence generally defined during installation. It is moreover noted that the majority of such one-time flexibility display is not transparent because multiple components have to generate (and thus focus on) the flexibility. In fact, the bending of flexible printable displays (e.g. possibly OLED displays) is limited to one single direction or cardinal, and hence multiple bending or deforming of the flex display sheet is strongly subject to wear, faulty connections or even broken components or connection parts. In other words, current flexible displays pose an interesting technical problem having only limited flexibility and representing the need for improvement in robustness of the display due to its frequent bending or deforming use.

Existing stretchable electronics are generally based on serpentine circuits, or meander geometry of interconnections as for example used in smartphone displays, or in a broader sense using a folded up or semi-bended electronic link for adaptively increasing (and afterwards capable of decreasing again) and hence stretching (and later on capable of compressing again) the distance between the electronic components. Stretchable electronics thus implies that more material, i.e. longer distance or link, is used for making the interconnections such that the stretching functionality can be performed. But, more material also means less space available between the electronic components, such as for example LEDs, for creating a higher resolution. Therefore, the use of known stretchable electronics according to the art, limits the required resolution for a display application, as we would often expect for a non-stretchable standard display system.

Aim of the Invention

The aim of the invention is to provide a real-time deformable and transparent display, or pixel (addressed) device in general, at any time retaining its deformable character of being capable e.g. of bending and stretching. More in particular, the aim of the invention is to provide a real-time deformable and transparent display being capable of displaying high-resolution video images.

SUMMARY OF THE INVENTION

In a first aspect of the invention, a method is provided for fabricating a deformable display, wherein the method comprises providing a circuit board, and providing an arrangement of pixels onto the circuit board. The method also comprises providing connections onto the circuit board in order to provide power to the pixels and/or to connect two or more pixels with each other, preferably providing amongst two or more pixels at least one data connection from one pixel to another. With deformable display is meant for example that the display can be bent or rolled up, or put into another shape or format, or even stretched out. The method further comprises of selectively, i.e. in a selective manner, removing substantial part of the circuit board in the areas where none of the pixels or connections there between are present, such that a degree of transparency is achieved and such that remaining part of the circuit board becomes deformable, while retaining its deformability. The method may comprise providing a driver module at each individual pixel for controlling the pixels on individual pixel level. According to an embodiment, the method comprises providing an arrangement of functional nodes in between the arrangement of pixels, wherein the functional nodes are connected with the pixels, wherein the pixels are for example light-emitting elements, such as light-emitting diodes (LEDs), and wherein the functional nodes are for example photovoltaic (PV) cells all or not provided with storage capacity, accelerators, gyroscopes, sensors, microphones/speakers, piezo elements, ultrasonic components, light-emitting elements. The method may further comprise providing a thermoplastic material wherein the pixels being connected with each other pixels are embedded, wherein the thermoplastic material is for example transparent. The thermoplastic material may be provided with perforations, and/or hardened parts, and/or connecting parts, and/or mechanical adjustments or attachments either globally for the entire device, or else applied locally. Moreover, the thermoplastic material may be provided with fire-retardant material, and/or with acoustic permeable material, and/or sound absorbing material, and/or optical components such as for example lenses, diffusers, or polarizers.

In a second aspect of the invention, a deformable display system is provided, comprising a plurality of circuit boards and an arrangement of pixels onto the plurality of circuit boards, such that at least a part of the plurality of circuit boards have one or more of the pixels being mounted thereon, and such that the pixels are connected with each other. Within the deformable display system, connections are provided amongst the pixels, i.e. on circuit board material while the pixels being mounted thereon, or directly onto the circuit boards. Such connections are intended to provide power to the pixels and/or to connect two or more pixels with each other. Preferably amongst two or more pixels at least one data connection from one pixel to another is provided. The arrangement of pixels onto the plurality of circuit boards, including connections there between, acts as a mesh shaped carrier being deformable in any direction at any time, without losing its deformability. The deformable display system may comprise a driver module for each individual pixel, provided onto the circuit board material, for controlling the individual pixel. The pixels can be light-emitting elements, such as for example light-emitting diodes (LEDs), such that the deformable display system is a light-emitting display system, such as for example a LED display system. The circuit boards can be flexible circuit boards, and/or the pixels can be connected with each other by means conducting paths, for example stretchable conducting paths, e.g. made of copper.

In a third aspect of the invention, a colour calibration method is provided, the method being performed by a processing system of a display system comprising a storage module. By means of example, the display system can be a deformable display system in accordance with second aspect of the invention. The method comprises following steps. A first set of colour points is defined wherein at least one colour, for example blue, is in the minority, and a second set of colour points is defined wherein the at least one colour, e.g. blue according to example, is in the majority. Next, a matrix formula is defined wherein colours to be added to the first or second set of colour points are calculated for achieving target colours for the first or second set of colour points. Target colours are defined as the colours wanted to be perceived on the display system. A first calibration matrix is then defined by the matrix formula for the first set of colour points, and a second calibration matrix is defined by the matrix formula for the second set of colour points. A matrix factor, being selectively chosen in relation to the at least one colour, e.g. blue, being in the minority or majority of the first or second set of colour points and hence the perception thereof being minor or major, is defined as a real number between 0 and 1. A final calibration matrix is defined by the first and second calibration matrix, both being weighed based on the matrix factor.

In a fourth aspect of the invention, a colour calibration method is provided for calibrating a display system in relation to colour points for a particular viewing angle. Depending on the viewing angle, under which one is looking at the display system, colours can be perceived rather different. By means of example, again the display system can be a deformable display system in accordance with second aspect of the invention. The method being performed by a processing system of a display system comprising a storage module, comprises following steps. A first set of colour points is defined for a first viewing angle, a second set of colour points is defined for a second viewing angle, and a third set of colour points is defined for a third viewing angle. Next, a matrix formula is defined wherein colours to be added to the first, second or third set of colour points are calculated for achieving target colours for the first, second or third set of colour points. Three calibration matrices are then defined. A first calibration matrix is defined by the matrix formula for the first set of colour points, while a second calibration matrix is defined by the matrix formula for the second set of colour points, and a third calibration matrix is defined by the matrix formula for the third set of colour points. A matrix factor, being selectively chosen in relation to first, second and third viewing angle colour points, is defined as a real number between 0 and 1. A final calibration matrix is defined by the first, second and third calibration matrix, each being weighed based on the matrix factor.

In a fifth aspect of the invention, a colour calibration method is provided for calibrating a display system depending on a display feature related to colour. Depending on the specifications, characteristics, or variable parameters of such display feature, colours can be interpreted rather different. The perceived colours can be influenced for example by temperature or amount of current flowing through light-emitting elements such as LEDs of the display system. By means of example, again the display system can be a deformable display system in accordance with second aspect of the invention. The method being performed by a processing system of a display system comprising a storage module, comprises following steps. A first to nth—n being an integer number—set of colour points is defined for respectively a first to nth display feature related to colour. A matrix formula is defined wherein colours to be added to the first to nth set of colour points are calculated for achieving target colours for the first to nth set of colour points. Then, n calibration matrices are defined wherein respectively first to nth calibration matrix is defined by the matrix formula for the first to nth set of colour points. A matrix factor, being selectively chosen in relation to the first to nth display features related to colour, is defined as a real number between 0 and 1. A final calibration matrix is defined by the first to nth calibration matrix, each being weighed based on the matrix factor.

The colour calibration method in accordance with third, fourth, or fifth aspect of the invention can be applied on a deformable display system in accordance with second aspect of the invention.

According to further aspect of the invention, a run-time colour calibration method performed by a processing system of a display system comprising a storage module, is provided wherein the method comprises: (i) loading operational conditions, e.g. in relation to at least one colour, for example blue, being in the minority or majority of the display system, (ii) computing, possibly real-time, of a final calibration matrix, based on the operational conditions, by combining or weighing a first and second, or either first, second and third, or else first to nth calibration matrix, as e.g. determined by the methods in accordance with respectively third, fourth, or fifth aspect of the invention, and thus these numbered calibration matrices being related to the determination of target colours to be achieved, more in particular being related to 'what to add' or colours to be added to the existing colours for achieving the target colours, whereas these numbered calibration matrices, i.e. first, second . . . to nth calibration matrix, are fetched from being stored in the storage module; and (iii) applying the computed final calibration matrix. By means of example, again the display system can be a deformable display system in accordance with second aspect of the invention.

According to an aspect of the invention, a computer program product is provided, operable on a processing engine, for executing any of the steps of the methods in accordance with third, fourth, or fifth aspect of the invention. According to an additional aspect of the invention, a non-transitory machine-readable storage medium storing the computer program product in accordance with above.

According to an aspect of the invention a real-time deformable and transparent pixel addressed device is provided, comprising a carrier comprising of a circuit board and conducting paths mounted thereon, and an array of pixels mounted onto the carrier, wherein the pixels are connected with each other by means of the conducting paths, wherein the circuit board of the carrier is partially removed, defining a mesh shape with transparency for the carrier having open spaces between the conducting paths and the pixels, and wherein the carrier having the mesh shape with transparency being deformable in any direction at any time without losing its deformability. With pixel addressed device is meant a device (e.g. a display but for example also a lamp or a light-emitting device in general can be interpreted) wherein either one or more individual pixels or one or more clusters of pixels can be given different data, such for instance colour data. A cluster of pixels can appear as one entity as if it would be just one pixel, or as if to be interpreted as one single pixel. In other words, the cluster appearing as a whole.

According to an aspect of the invention a calibration technique is provided for a pixel addressed device, for example a real-time deformable and transparent pixel addressed device in accordance with previous aspect above. With this calibration technique, more in particular being a colour calibration technique, the colours of the pixels within the pixel addressed device can be adapted real-time dynamically depending on the content of the video or images, giving the impression that much deeper saturated colours can be seen.

BRIEF DESCRIPTION OF THE DRAWINGS

FIGS. 2a-b show an embodiment of the control signal generated in different ways in accordance with the invention, wherein in (a) every LED or pixel node being sequentially connected, whereas in (b) there is only one single control line is for all LEDs or pixels.

FIGS. 3a-b show an embodiment of local control or local interface for enabling modularity within a display system, in accordance with the invention.

DETAILED DESCRIPTION OF THE INVENTION

Figure 1:
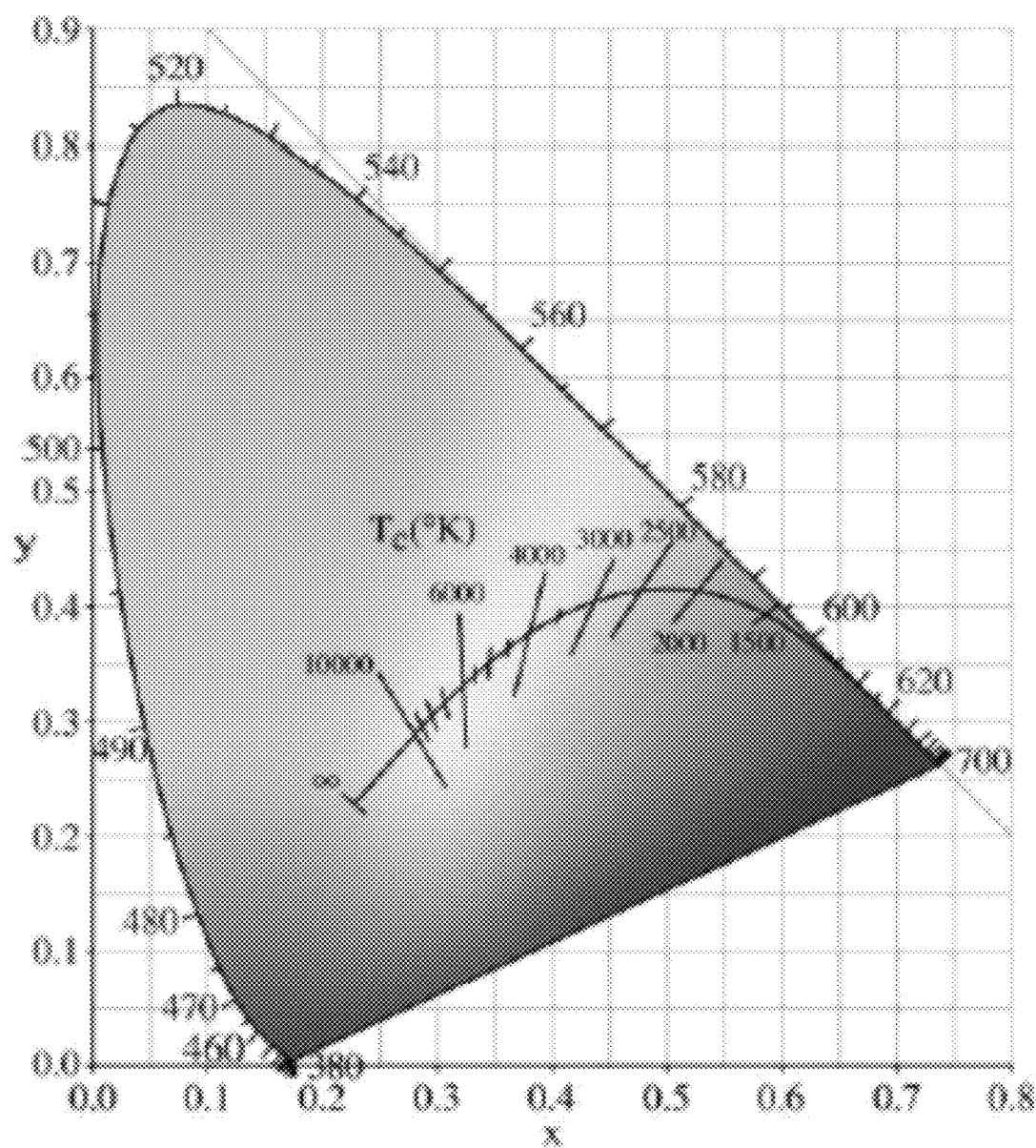
FIG. 1 shows the aspect of multiplexing within a display matrix, here for example for an OLED display, in accordance with the prior-art.

The invention provides a real-time deformable and transparent pixel addressed device, such as a display, or more in particular for instance a LED display, at any time retaining its deformable character of being capable e.g. of bending and stretching. The invention moreover provides a real-time deformable and transparent display being capable of displaying high-resolution video images. With real-time deformable display is meant that the display is deformable instantly or immediately upon request, or as a user of the display wishes it to be. In addition, the display is deformable while maintaining deformability. In other words, the display can be deformed with reversibility, meaning that the display cannot only be deformed but is also capable of returning to an original condition or a former status or shape.

The invention addresses a solution for the problems or drawbacks as stated in the background of the invention described above. The way any of these problems were tackled, solutions emerged and finally how all parts of the invention have come about, will now be described.

As mentioned earlier, due to their ITO layers with high resistivity, current transparent displays, for example based on LCD or OLED with acceptable resolution, are not really suitable for video applications. As a solution, one could think of adding more metal to the display structure for enhancing conductivity and decreasing resistivity, however this would also mean losing in transparency. Using more metal would further result in a kind of mirror effect because of the reflections of the added metal. Moreover, such solution would significantly complicate the manufacturing process.

Although a transparent LED display, avoiding ITO layers and their negative impact for video applications, does exist, the resolution of such LED display is so poor that it cannot be considered, whereas there is actually no comparison to be made. As an indication for this low resolution, by means of example, the pixel pitch is e.g. in the range of >8 mm. In addition, standard LED displays all have rather heavy and bulky equipment, amongst which for instance the mechanical carriers, PCB boards with components, and driver chips. A lightweight high-resolution transparent LED display solution is not available in the art.

Lightweight high-resolutions display solutions can be found amongst the flexible displays. However, as described above, known flexible displays are usually limited in bending or deforming, have only flexibility in one single direction, and therefore are very much subject to wear, faulty connections or even broken components or connection parts.

Adding more flexibility in multiple directions instead of for example one or two orthogonals can be achieved with stretchable electronics, although, on the other hand, these result in having more material and hence less space available for creating a high-resolution application. A possible solution for this lack of space, in case of a LED display for instance, is providing the LEDs (e.g. RGB LEDs) in a grid or matrix structure while assembled onto a multilayer PCB ensuring all connections and interconnections from anode to cathode. Reducing the number of connections can also be achieved by means of multiplexing of connections within the circuit. Multiplexing, a known technique in the display industry, is often also referred to as scanning, while scanning rows or arrays one by one, and lighting the needed LEDs sequentially only in one row or array at the time. In either way, by means of using stretchable electronics, and particular circuit layout and display architecture, a high-resolution display solution is yet provided. The high-resolution display can now be made transparent, for example by means of removing unused or uncovered PCB in between the electronic circuit components and interconnections. In order to provide a high-resolution transparent display being flexible, the PCB (either single layer or multilayer) used is not standard epoxy but instead a flexible PCB is provided with the electronic circuit including stretchable electronics for delivering higher flexibility than common flexible displays having by default limited deformability. In accordance with the invention, a high-resolution transparent stretchable and flexible display is provided characterized by being deformable, and moreover this deformability can be real-time while maintaining deformability. According to an embodiment, the stretchable electronics covering a flexible PCB, comprise meander paths, e.g. made of copper, in between more rigid electronic components representing for example the nodes where light-emitting diodes (LEDs), or light-emitting elements in general, can be mounted. In order to achieve transparency, the flexible PCB material not covered with stretchable electronics, nor with any other electronics and thus uncovered or unused flexible PCB material not having any electronic functionality, can be removed for instance by means of lasering, punching, waterjet, milling or any other possible abrasive process.

The aspect of multiplexing as possible solution for reducing the number of connections within a circuit is now further considered, while referring to FIG. 1, illustrating multiplexing within a display matrix—here by means of example an OLED display is shown—as known in the art. Traditional LEDs in display applications are commonly driven using a passive matrix structure, herewith referring for example to the common anode principle, although common cathode is also a possibility. Applying multiplexing within the passive matrix LED display, will result in lots of connections. Considering for instance a rectangular LED display, strongly and efficiently multiplexed, only one of the four display sides e.g. is provided with a huge amount of connections, particularly in case of a high-resolution configuration. Such huge amount of connections causes difficulties, and is in fact not desired. In accordance with the invention, a solution is foreseen tackling this problem, and hence reducing the number of connections between the pixel nodes of a light-emitting display. According to an embodiment, at each of the pixel nodes, where a LED is mounted, a local pixel driver or LED driver for each individual pixel or LED is also provided. As a result, per pixel node or per LED node, only a LED voltage and a control signal are provided, and herewith three connections (e.g. $V_{LED}$, GND and a—possibly digital—signal) are sufficient per LED or pixel node for such voltage and control signal. The control signal at a particular LED will communicate to the LED driver via a protocol (e.g. at driver IC or electronics) how much light should be emitted by this LED. In general, in display applications a large amount of similar or identical LEDs are used, hence similar or identical LEDs are used over a particular display surface, and therefore (the same) LED voltage can be offered at each individual LED or pixel node. A significant amount of multiplex connections are herewith yet eliminated. The control signal, possibly digital, can be generated in different ways as illustrated in FIGS. 2a-b. For a first option is for example referred to NeoPixel, Adafruit's brand for individually-addressable RGB color pixels and strips based on the WS2812, WS2811 and SK6812 LED/drivers, using a single-wire control protocol. Traditionally, is herewith made use of an input and output signal wherein every node is sequentially connected, as schematically represented in FIG. 2a wherein a node 202 as well as the sequential control signal as input 201 and as output 203 are illustrated. With this configuration, the position of a LED in the grid can be determined by means of transmitting particular information or data, for which can be further referred to datasheets of the LED drivers. Alternatively, as opposed to the NeoPixel principle, each driver IC has a unique address such that the control signal no longer needs to be transmitted via input/output but can be offered at each individual pixel node, each driven by an individual LED driver. Hence, for the other option, only one single control signal or control line is needed for all LEDs or pixels, as depicted in FIG. 2b wherein a pixel node 206 and the control line 204 including a branch 205 thereof to the particular pixel node 206 are shown. As a consequence, routing becomes much easier and moreover, a sort of redundancy is herewith provided, whereas in case the control signal is interrupted somewhere, the remainder of the circuit may stay active. For both ways of generating the control signal, the advantage is that for instance a square or rectangular (or other polygon shaped) display can be cut in arbitrary forms without losing video or image. However, in case of the alternative option (as opposed to the one based on NeoPixel principle) for generating the control signal, the potential in arbitrary forms is rather unlimited, whereas for the other control signal configuration the number of possibilities is limited due to the sequential line or circuit.

It is noted that the LED driver or pixel driver could be a TFT circuitry or any traditional silicon based driver.

As mentioned above, according to an embodiment of the invention, a local driver system is provided for each individual pixel or LED resulting in much less connections needed as compared to traditional multiplex systems, meaning that multilayer PCBs or multilayer flexible (or flex) PCBs are required. Hence, with the local driver system, either cheaper display systems can be offered because of a significant reduction in amount of (flex) PCB layers, although taking into account the additional cost of the individual LED or pixel drivers. On the other hand, instead of cheaper systems, more efficient and better performing multilayer systems can be offered comprising extra redundancy. For example, making further use of the multilayer architecture, not just one LED voltage $V_{LED}$, but a plurality of LED voltages $V_{LED1}$, $V_{LED2}$ ... $V_{LEDn}$ parallelly connected could be provided for 1, 2 ... n layers of (flex) PCB material. Whenever one e.g. $V_{LED1}$ line or circuit fails, the other $V_{LED2}$ ... $V_{LEDn}$ lines remaining operative can still be used. In addition, when having such a plurality of parallelly connected LED voltages $V_{LED1}$, $V_{LED2}$ ... $V_{LEDn}$ for a particular circuit part, instead of just one $V_{LED}$ voltage line, the overall resistance of this particular circuit part will decrease, therefore the current will increase, and thus the efficiency of the LED display will improve. Referring further to the multilayer configuration, having more $V_{LED1}$, $V_{LED2}$ ... $V_{LEDn}$ lines results in more "cutting" opportunities for reshaping and/or (re)design based on arbitrary forms. Moreover, with the local driver system and pixel node addressing accordingly, in addition to more cutting options, more "pasting" options are also feasible. In other words, there is more freedom or flexibility and there are more ways of seamlessly putting together displays or display segments. A modular system 301, 304 can hence be built, as illustrated by means of example in FIGS. 3a-b. Multiple display segments 302, 305 can seamlessly be put together, and are each provided with a local control 303, 306 or local interface. FIG. 3a and FIG. 3b respectively illustrate a difference in display segment design, in terms of location chosen for providing the local control 303, 306. In FIG. 3a the local control 303 for each display segment 302 is positioned in the left top corner of each the display segment 302, whereas in FIG. 3b the local control 306 for each display segment 305 is positioned in the centre of each display segment 305. The applicability and use of the local control 303, 306 is a result of, in the first place having a local pixel driver or local LED driver for each individual pixel or LED, and as a consequence applying only one single control signal or control line for all LEDs or pixels.

Having now much less connections needed with the local driver system, more technical space becomes available to provide extra nodes in between the existing LED or pixel nodes of the LED matrix, and herewith offering additional functionality. By means of example, photovoltaic (PV) cells can be mounted or assembled at the extra nodes, and hence a power system can be integrated within the display application. The PV system may further include an integrated battery solution or storage device. A standalone display system can thus be offered without the need for any additional external power supply, or wired connection to the electrical grid. The extra nodes can also be provided with infrared light emitting elements, or so-called active markers used in an optical tracking system. Via selective camera systems, the infrared light, being invisible and having safe intensity for the human eye, can act as feedback to source images enabling compensation of geometrical deformation of a display. Further, resistive or capacitive nodes can be integrated in order to provide interaction with the display, such as for instance pressure sensors for a touch display. Next to possible additional functionalities for the extra nodes yet mentioned, one can also refer to other commonly known internet-of-things (IoT) applications, amongst which e.g. gyroscope, accelerator, microphone/speaker, piezo elements, ultrasonic components, and sensors such as for example motion sensors.

Figure 4:
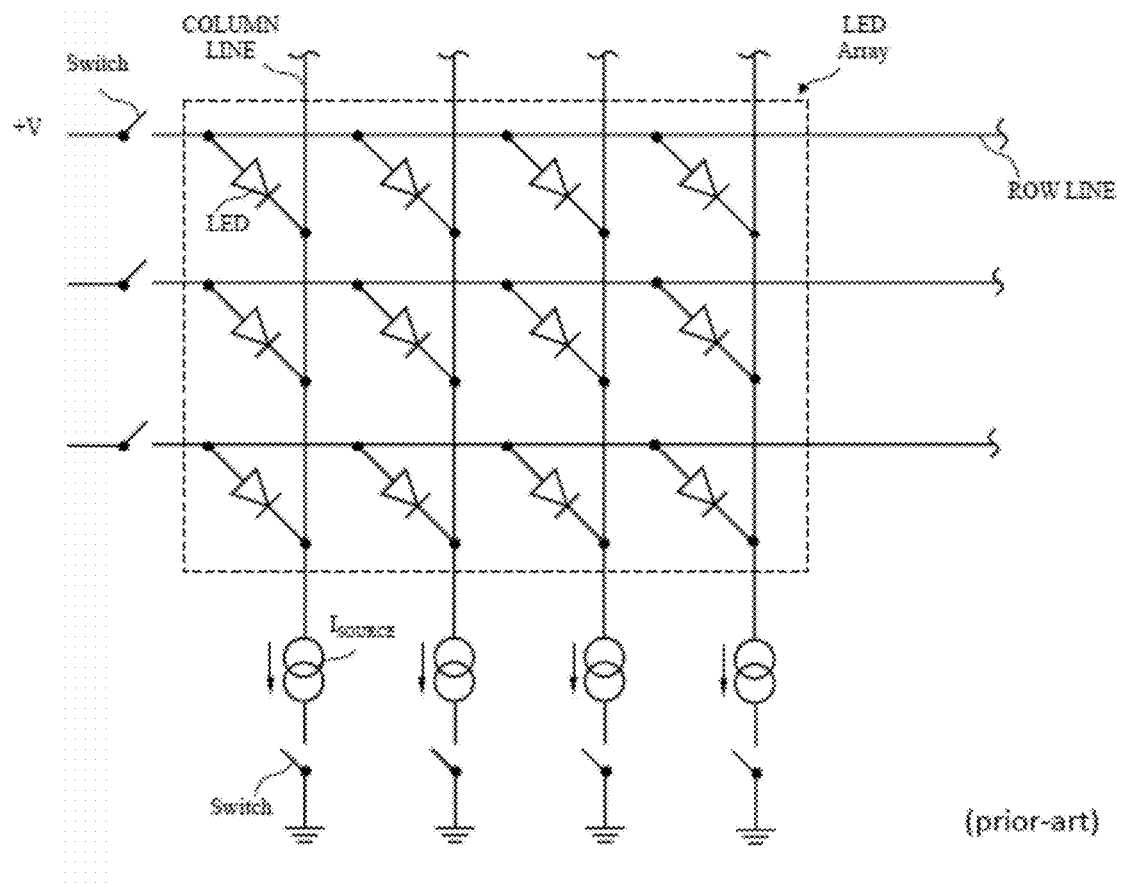
FIG. 4 illustrates a chromaticity diagram also known as the CIE 1931 colour space.

FIG. 4 illustrates a chromaticity diagram, the CIE 1931 colour space in particular, which is provided as a reference for the discussion regarding real-time positional and content dependent calibration for the presently disclosed real-time deformable and transparent pixel addressed device. Since many different LEDs are used, is known from the art that calibration of the LEDs is an important aspect, whereas each individual LED may deviate in colour, brightness etc. . . . . The calibration principle to make light-emitting elements (e.g. LEDs, OLEDs) or pixels appear uniform on a display is common as well as the mathematics behind it. This principle is based upon individual measurements at a given drive current for every pixel in the display. In case of an RGB (Red, Green, Blue) display, the measurements e.g. performed in the CIE 1931 colour space, wherein every colour is represented in (x, y) and Y, are for example:

$$Rin = (Rinx, Riny, RinY) = (RinX, RinY, RinZ)$$
$$Gin = (Ginx, Giny, GinY) = (GinX, GinY, GinZ)$$
$$Bin = (Binx, Biny, BinY) = (BinX, BinY, BinZ)$$

It is noted that (x, y) are normalized values of X, Y, and Z being the so-called tristimulus values, whereas Y is a measure for the luminance of a colour.

As mentioned yet, for all LEDs or pixels there is a deviation in colour and light output. After analysis of these deviations, a 'common' target for the individual colours can be set. In general, this common denominator is the value of light output and colour that every LED or pixel can achieve. For the sake of clarity, target colours are herewith defined. In case of the RGB display, three target colours are hence determined: Rtarg, Gtarg and Btarg, wherein for example for the colour red:

$$Rtarg = (Rtargx, Rtargy, RtargY) = (RtargX, RtargY, RtargZ) \text{ and}$$
$$RtargX = RinX \cdot RonR + GinX \cdot GonR + BinX \cdot BonR$$
$$RtargY = RinY \cdot RonR + GinY \cdot GonR + BinY \cdot BonR$$
$$RtargZ = RinZ \cdot RonR + GinZ \cdot GonR + BinZ \cdot BonR$$

Herein, RonR is the multiplier needed for the red colour individual, whereas GonR indicates how much green needs to be added and BonR is the amount of blue to be added to red such that the desired new red target colour can be achieved.

In matrix format this leads to the equation:

$$\begin{bmatrix} RonR \\ GonR \\ BonR \end{bmatrix} = \begin{bmatrix} RinX & GinX & BinX \\ RinY & GinY & BinY \\ RinZ & GinZ & BinZ \end{bmatrix}^{-1} \cdot \begin{bmatrix} RtargX \\ RtargY \\ RtargZ \end{bmatrix}$$

Or for all three colours we have:

$$\begin{bmatrix} RonR & RonG & RonB \\ GonR & GonG & GonB \\ BonR & BonG & BonB \end{bmatrix} =$$

$$\begin{bmatrix} RinX & GinX & BinX \\ RinY & GinY & BinY \\ RinZ & GinZ & BinZ \end{bmatrix}^{-1} \cdot \begin{bmatrix} RtargX & GtargX & BtargX \\ RtargY & GtargY & BtargY \\ RtargZ & GtargZ & BtargZ \end{bmatrix}$$

According to an aspect of the invention, while applying the calibration principle, it is not necessary to make the complete set of parameters positive, moreover it may even be preferred for achieving a better colour saturation in the individual colours. Negative coefficients are thus allowed and may in general yield the right mixed colour, especially when considering white. Negative coefficients mean that the individual colour cannot be calibrated (with corresponding calculations) to the saturated target colour. However, when taking negative coefficients always into account, they remain "present" and still can have effect when mixing other input colours, herewith preserving the desired colour when mixed. When allowing negative coefficients, deeper or more saturated colours can be viewed, or virtually deeper colours are taken into account for the calibration calculations.

The above calibration principle works fine, but there is a serious flaw in the CIE definition of colours. This standard was made long ago, when monochromatic light sources or narrowband emitters, such as LEDs, did not exist. Further on, the chromaticity diagram does not take into account brightness differences of colours. Moreover, a well-known problem is that whenever narrowband emitters are mixed together, the colour perception of the mixed colour could be completely different from what is measured with for instance a spectrometer. Two colours having exactly the same reading on the spectrometer could be perceived completely different by the human eye due to e.g. mixing narrowband emitters and/or not considering the brightness. This is especially true when for example blue colour is calibrated and shifted toward a less saturated blue colour. The mix ratio (addition of red and green colour) to the native blue can have totally different visual effects. The human eye or brain locks to the most perceived 'sharp' colour (being mostly red), thereby omitting completely the other colours having a less sharp perception (such as blue). So, although—as according to CIE 1931—colours measure exactly the same, they are perceived totally different by the human eye. It is also commonly known in the display industry that less bright colours are perceived to be more saturated i.e. more deep, meaning closer to the edge of the CIE curve. While referring to both mixing narrowband emitters and brightness issues above, it is perfectly possible to match for instance two different blue colours by changing for example brightness of the less saturated colour, i.e. making its perception to be more deep. For instance, by means of reducing the brightness of the less saturated colour, one can reach the more saturated or more deep colour (as being perceived). Applying this in combination with slight calibration (also known as clipping, which means putting an artificial limitation to adding red or green to blue for calibrating further on brightness) results in a display being calibrated to the human eye correct perceived colours. An important consequence however is that, since the brightness is changed, this means that for that particular colour, when mixed with other saturated colours, the desired perceived colour is not achieved anymore. So, when using that calibrated colour with less light output, the mixed colour points are wrong. This can be solved easily by choosing the original (computational correct) values.

In accordance with an aspect of the invention, the calibration data is computed real-time (and thus not stored) according to the present video content per individual pixel. Hence, saturated colours are adjusted independently of mixed white, such that the adjusted white point does not change with changing saturated colours. The main advantage is to overcome herewith visual perception issues that are not documented yet by the CIE colour standards while not assuming brightness variations. Especially for narrow-band emitters (e.g. LEDs), mixed colours can give a visual perception completely different from what is measured. According to an aspect of the presently disclosed invention, the colours of the light-emitting elements could be adapted dynamically depending on the content of the video or images, by means of a colour calibration technique, giving the impression that much deeper saturated colours can be seen. This colour calibration technique overcomes the above-described drawbacks (e.g. visual perception issues) and gives us a means for adjustment and correction. Initial design should use this technique, especially for the blue channel (but can be used for all different channels if required).

Human eye factors can be distinguished in terms of resolution perception on one hand, and in terms of colour perception on the other hand. Regarding resolution perception, it should be noted that this is the most sensitive in the red component, and the less sensitive in the blue component (e.g. try reading blue text on black background). In case of colour perception, given the situation of the same luminance, most sensitive perceived is in x direction, and less sensitive in y direction. Considering colour perception with luminance variation, an extra dimension should be added, whereas less luminance is perceived as deeper or more saturated colour.

The above is further taken into account in terms of calculations for colour calibration. According to an aspect of the invention, two calibration matrices instead of one are proposed for defining the final calibration, and providing herewith a solution to the visual perception problems as described above. One calibration matrix, further referred to as MixMatrix, is defined as the matrix to be used when more colours are shown simultaneously. The other matrix, further referred to as BlueMatrix, is defined as the matrix to be used when the target saturated colour (in this example blue) needs to be shown. This is usually the matrix where the brightness of the blue colour is reduced, resulting into deeper colour perception. In order to achieve correct mixed colours and maintain correct white point, a formula needs to be applied wherein the final calibration matrix, further referred to as FinalMatrix, is a function of the input colour values, and can hence defined as a function of the MixMatrix and the BlueMatrix, both respectively related to particular type of content. The colour calibration technique in accordance with the invention is therefore also referred to as content dependent calibration, whereas a weight factor depending on the content is applied for calculating the final calibration matrix.

$$FinalMatrix = \text{Factor} \cdot MixMatrix + (1 - \text{Factor}) \cdot BlueMatrix$$

The Factor in the formula above is 1 when only the blue saturated target colour needs to be shown, i.e. no red and green colours are to be shown. The Factor equals 0 when all (or more than one) colour is available. All kinds of variations for the Factor can be deducted. By means of example, the Factor can be:

$$\text{Factor} = 2(Rin + Gin)/(Rin + Gin + Bin) \text{ wherein } 0 \leq \text{Factor} \leq 1$$

With the above definition of the Factor, the Factor is indeed 0 when there is no red or green in the signal. Then FinalMatrix=BlueMatrix. In case there is a total signal R=1, B=1, and G=0 then Factor becomes 1. In other words, when there is total mix with another colour, the Factor becomes 1.

MixMatrix or Matrix1 and BlueMatrix or Matrix2 can be stored for every individual pixel of the display. Factor is calculated using RGB input values (content) for that particular pixel. According to the formula FinalMatrix can be calculated and then the traditional pipeline or calculation as described for the traditional calibration principle can be used. According to an embodiment, whereas Matrix1 and Matrix2 are stored, FinalMatrix is calculated real-time. The principle can be used and/or expanded for all three or more primary colours in a display. In the case of a real-time deformable and transparent pixel addressed device, such as a display, in accordance with the invention, one can on top of this use the same pipeline to compensate for viewing angle differences.

Figure 7:
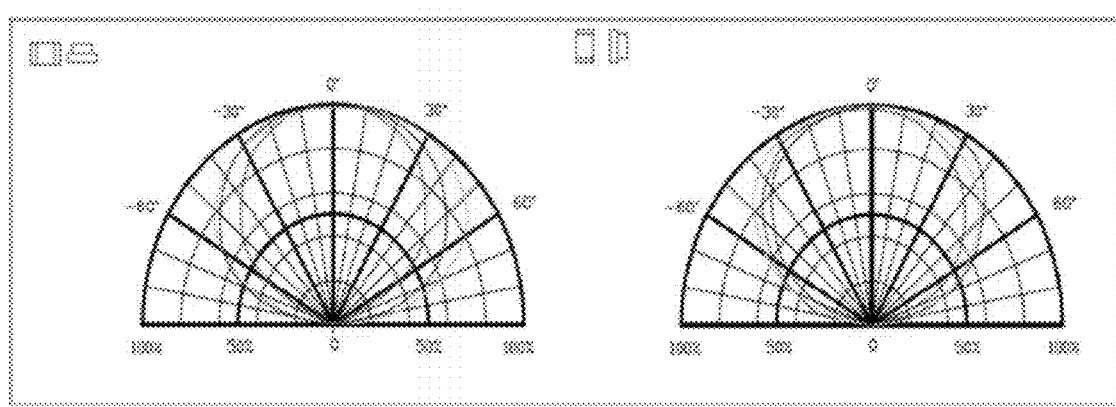
FIG. 7 illustrates a viewing angle graph of an exemplary LED, in accordance with the art.

With FIG. 7 is referred to the viewing angle graph of an example of an LED. One can notice that under an angle, the brightness of the individual colours is different. This fact however becomes very important in case of a display or screen continuously moving position. By moving position, an observer watching the display will also perceive different brightness for the individual pixels. When there are multiple primaries shown, this in fact means that the colour points are not accurate anymore. The above colour calibration technique in accordance with the invention, can be applied with two or more matrices wherein e.g. Matrix1 is the matrix under viewing angle 0°, Matrix2 is the matrix under viewing angle of 45° horizontal and a third matrix Matrix3 is for example for viewing angle of the LED under 45° vertical. For the final calibration matrix calculation, FinalMatrix can then be defines as:

$$FinalMatrix =$$
$$A \cdot \text{Matrix1} + B \cdot \text{Matrix2} + C \cdot \text{Matrix3 wherein } A + B + C = 1$$

Depending on the angle viewed, FinalMatrix will adapt. Hence, one can compensate real-time for colour and brightness differences on the display.

To detect for instance angle variations on the display, one can add e.g. local gyroscopes or add local infrared markers. Such infrared markers can be interpreted by a processing system wherein feedback is given to the matrix processing side to determine R, G and B.

Figure 5A:
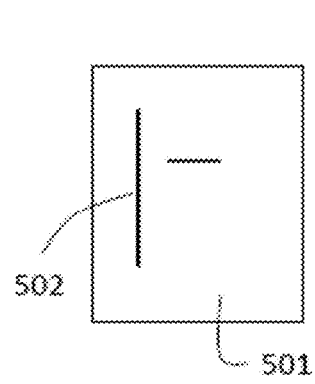
FIG. 5a-c schematically illustrates an embodiment of different types of display images, from (a) fixed to (b) deformable, to (c) real-time deformable image, for which calibration can be applied, in accordance with the invention.
Figure 5B:
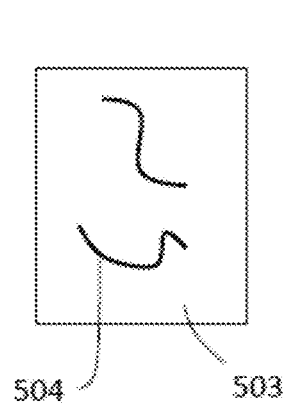
Figure 5C:
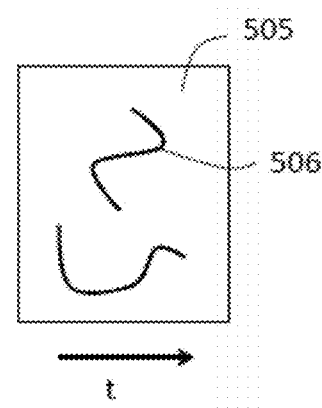

As mentioned earlier, the invention provides a real-time deformable and transparent pixel addressed device, such as a display. The deformable character means that calibration should also be taking place at an angle. In accordance with the invention, FIGS. 5a-c illustrates an embodiment of different types of display images 501, 503, 505, more in particular in FIG. 5a a fixed image 501, in FIG. 5b a deformable image, and in FIG. 5c a real-time deformable image is respectively shown for which calibration can be applied. The fixed character of the fixed image 501 is indicated with straight lines 502, whereas the deformable character of the deformable image 503, 505 is indicated with curved lines 504, 506. Moreover, the real-time deformability in Figure (c) is further indicated with the arrow t where t stands for time.

The mechanical aspects of a real-time deformable and transparent pixel addressed device, such as a display, in accordance with the invention, are now discussed. In general, with these mechanical aspects is referred to for example the interconnection between different parts of a display in accordance with the invention, as well as encapsulating such display, e.g. by means of silicon, tensioned within a frame, all or not combined with using nylon. Improving robustness while retaining transparency, the real-time deformable and transparent display in accordance with an embodiment of the invention, can be embedded within a transparent thermoplastic material. Moreover, the transparent thermoplastic material provided over the LED may lead to a lens function (including Fresnel lens for example), diffusion, or another possible optical effect (e.g. stereoscopic, 3D or holographic). Polarizers could be provided with or within the transparent material such that a 3D-display could be generated. Furthermore, because of the very high transparency of the display according to the invention, the display could also be applied in typical Pepper's Ghost set-up, and herewith also generating a kind of 3D-display. According to another embodiment, not only a transparent thermoplastic material is provided, but the display also remains to have a degree of perforation, as particularly desirable for outdoor applications. The perforation can be arbitrary, or can match the original display structure, in any case resulting in a lighter display in weight, and being less vulnerable for wind load. The transparent thermoplastic material, or possibly any other—all or not transparent—material wherein the display is embedded, can moreover be provided with further functionality such as for example local hardening, mechanical reinforcements, hooks, rings, buttons or interruptions for mechanical stiffness, or a connecting piece for attaching any mechanical design in accordance with the application, e.g. honeycomb floor mats, or curtains. The local hardenings can be used for instance for all kinds of mechanical attachments, such as holes for screws, cords, buttons, or knots. The stretch functionality or deformable character of the display in accordance with the invention, can be locally "frozen" by means of locally hardening certain pieces of the display, instead of the entire display for instance. According to an embodiment, the thermoplastic material is not only transparent, but also acoustically permeable, such that a display can be mounted in front of a loudspeaker, and hence the display is not hindering in terms of audio signal reduction. According to a particular embodiment, a real-time deformable and transparent display with acoustic permeability is provided onto a tensioned transparent MYLAR foil, and then this MYLAR foil is controlled by means of the electrostatic loudspeaker principle as known in the art. Hence, a system is provided delivering together sound and images. Of course such MYLAR foil requires stretchability and continuous deformability, as does the display being provided thereon. In contrast to acoustic permeability, according to an embodiment, the display in accordance with the invention could also be provided with sound absorbing material. Further referring to connecting or attaching other parts to a display in accordance with the invention, it is noted that a display generally represented by a mesh or grid structure, can be interpreted as traditional textile, in terms of being connectable through all possible connecting textile principles, amongst which e.g. knitting, sewing, crocheting, stitching, buttening up, or sticking. Attaching display parts or material to textile, as well as connecting display parts with each other are interpreted herewith. By means of example, display parts could also be connected with each other by means of a zipper. In addition to those connecting textile mechanisms, embodiments also cover attaching display parts (e.g. to each other, or onto a particular surface) by means of a permanent (e.g. glue, epoxy) or semi-permanent (e.g. post-it) adhesive.

According to a particular embodiment, the deformable display in accordance with the invention is combined with 3D-printing applications. By means of example, 3D-printed material can be combined with a particularly shaped deformable display.

It is particularly mentioned that a deformable, i.e. stretchable and flexible display in accordance with the invention, due to its flexibility (and stretchability) can be rolled up, and hence transportation of such a display can be facilitated, in terms of space and manageability.

Particularly for outdoor display applications, LEDs are more favourable while being more ruggedized than LCD, OLED or plasma and therefore withstanding more severe environmental conditions in terms of e.g. temperature or other weather conditions. By means of example, transparent OLED displays in automotive applications, e.g. applied onto a car's back window can be used, although getting quickly depleted or worn out due to break down of the organic material because of high temperatures of direct solar impact. With a transparent LED display, according to an embodiment of the invention, such rapid deterioration will not occur.

Given the above design choice of a real-time deformable and transparent display, the invention further addresses that the display and the carrier, i.e. the PCB, are one resulting into a much lighter display system than other standard comparable displays wherein an additional frame is further needed onto which further components are mounted.

It is worth emphasizing that while using a flexible PCB as described earlier, not only one side (front-side) but in fact both sides (front-side and backside) of the flexible PCB could be used and hence may be covered with circuit components, LED nodes in particular, and stretchable electronics e.g. meander electronic paths in between the circuit components of a LED matrix display structure. In other words, the backside in addition to the front-side of the flexible PCB can be assembled and manufactured herewith representing a display, and thus a dual sided deformable display is generated, in accordance with the invention. The video or images or settings correspondingly, don't have to be similar or even identical on both sides, and may therefore differ such that for example on one side high quality high-resolution video is applied, whereas the other side is e.g. displaying only text, as could be thought of for instance in an auto queue for broadcasting applications.

Figure 6:
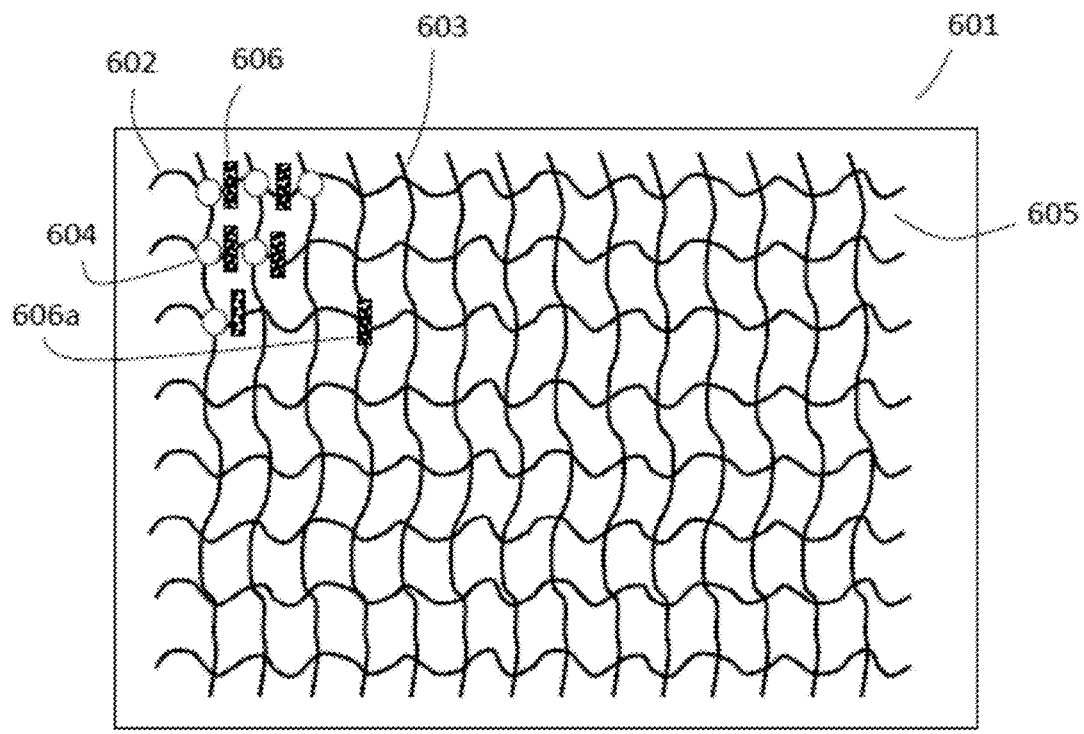
FIG. 6 shows an embodiment of a real-time deformable and transparent pixel addressed device in accordance with the invention.

Referring now to FIG. 6, an embodiment is given for a real-time deformable and transparent pixel addressed device 601, such a display, in accordance with the invention. Vertical 603 and horizontal 602 conducting paths are herein illustrated, as well as pixels or LEDs 604 at nodes where these vertical 603 and horizontal 602 paths cross each other. At spaces in between the pixels or LEDs 604 further functionality can be added by means of the additional nodes 606, providing e.g. photovoltaic PV cells or infrared markers or sensors. However, such further functionality can also replace a regular LED or pixel by means of mounting the additional node 606a, in case would be desired or required by the design of the pixel addressed device 601, which can be embedded in or covered with thermoplastic material 605.

The invention claimed is:

1. A display comprising:
   a circuit board;
   an arrangement of pixels provided on or in the circuit board, each of the pixels being addressable LED surface-mount pixels; and
   electrical conductive parts comprising copper connections between the pixels of the arrangement of pixels on or in the circuit board; and
   a plurality of integrated drivers, each of the integrated drivers respectively being provided at a corresponding one of the pixels of the arrangement pixels, each of the integrated drivers being configured to control its corresponding pixel,
   wherein the display is a meshed display due to removed portions of the circuit board in a grid structure,
   wherein a sufficient part of said circuit board is removed in said meshed display such that open spaces are provided as through-holes between the electrical connections and the pixels are created, and
   wherein the portions of the circuit board that are removed are where the pixels or the electrical connections therebetween are not present,
   wherein each of the integrated drivers is integrated with its corresponding pixel, and
   wherein each of the integrated drivers is configured to received and be controlled by a single-wire control protocol.

2. The display according to claim 1, wherein the portions of the circuit board that are removed are between the pixels or electrical connection.

3. The display according to claim 1, wherein the portions of the circuit board that are removed are between individual pixels of said arrangement of pixels.

4. The display according to claim 1, wherein the circuit board has perforations provided therein due to said portions of the circuit board removed.

5. A display comprising:
   a circuit board;
   an arrangement of pixels provided on or in the circuit board; and
   electrical connections between the pixels of the arrangement of pixels on or in the circuit board,
   wherein the display is a meshed display due to removed portions of the circuit board,
   further comprising a driver at each of the individual pixels of the arrangement pixels, each of the drivers being configured to control a respective individual pixel.

6. The display according to claim 1, comprising a plurality of circuit boards;
   wherein an arrangement of pixels is provided on or in each of the plurality of circuit boards, such that at least a part of said plurality of circuit boards have one or more of said pixels being mounted thereon, and such that said pixels are connected with each other.

7. The display according to claim 6, wherein the display comprises electrical connections that provide power to said pixels and/or to connect two or more of said pixels with each other.

8. The display according to claim 6, further comprising a plurality of drivers arranged such that one of said drivers is provided for each individual pixel, wherein the plurality of drivers are arranged on at least one of said plurality of circuit boards, for respectively controlling each of the individual pixels.

9. The display according to claim 1, wherein the display is deformable or flexible in at least one direction.

10. The display according to claim 1, wherein the display is deformable or flexible in two or more orthogonal directions.

11. The display according to claim 1, further comprising a thermoplastic material, wherein pixels of the arrangement of pixels are arranged on or embedded in the thermoplastic material.

12. The display according to claim 11, wherein the thermoplastic material is transparent.

13. The display according to claim 11, wherein the thermoplastic material is locally hardened in one or more areas of the display.

14. The display according to claim 11, wherein material on which or in which the pixels are embedded provides mechanical stiffness and/mechanical reinforcement.

15. The display according to claim 1, the circuit board is provided with optical components, lenses, diffusers, or polarizers.

16. The display according to claim 1, wherein the perforations are arranged arbitrarily.

17. A method for fabricating a display according to claim 1, the method comprising:
   providing the circuit board;
   providing the arrangement of pixels on or in the circuit board;
   providing the electrical connections between the pixels of the arrangement of pixels on or in the circuit board;
   removing at least part of the circuit board such that the display is a meshed display,
   wherein a sufficient part of said circuit board is removed in said meshed display that open spaces as through-holes are provided between the electrical connections and the pixels are created, and
   wherein the portions of the circuit board that are removed are where the pixels or the electrical connections therebetween are not present.

18. The display according to claim 1, wherein material of the circuit board is provided with a fire retardant material.

19. The display according to claim 1, wherein material of the circuit board is provided with an acoustic permeable material.

20. The display according to claim 1, wherein material of the circuit board is provided with a sound absorbing material.

21. The display according to claim 1, further comprising an arrangement of functional nodes between pixels of the arrangement of pixels, wherein the functional nodes include photovoltaic (PV) cells.

22. The display according to claim 21, wherein each of the one or more of said photovoltaic (PV) cells include an energy storage device.

23. A deformable display comprising the display according to claim 1,
   wherein the open spaces provided in the display are configured such that the display is acoustically permeable, and
   wherein the display is provided on a deformable mylar foil that is configured to be controlled by an electrostatic loudspeaker.

24. The display according to claim 1, wherein material of the circuit board is locally hardened in one or more areas of the display.

* * * * *